United States Patent [19]
Maya

[11] Patent Number: 6,136,704
[45] Date of Patent: Oct. 24, 2000

[54] METHOD FOR FORMING POROUS PLATINUM FILMS

[75] Inventor: Leon Maya, Oak Ridge, Tenn.

[73] Assignee: UT-Battelle, LLC, Oak Ridge, Tenn.

[21] Appl. No.: 09/320,225

[22] Filed: May 26, 1999

[51] Int. Cl.[7] .................................................. H01L 21/44
[52] U.S. Cl. ........................ 438/680; 438/678; 438/738; 438/238; 438/3
[58] Field of Search .............................. 430/323; 205/65; 427/160, 126; 28/633; 260/580; 438/14, 680, 678, 738, 238, 3; 204/192.21

[56] References Cited

U.S. PATENT DOCUMENTS

| | | | |
|---|---|---|---|
| 4,039,698 | 8/1977 | Fraser et al. | 430/323 |
| 4,401,693 | 8/1983 | Frank et al. | 427/160 |
| 4,627,902 | 12/1986 | Johnston et al. | 204/192.4 |
| 4,913,782 | 4/1990 | Seiger | 205/65 |
| 5,789,320 | 8/1998 | Andricacos et al. | 438/678 |
| 5,874,364 | 2/1999 | Nakabayashi et al. | 438/738 |
| 5,918,118 | 1/1999 | Kim et al. | 438/238 |
| 6,054,331 | 4/2000 | Woo et al. | 438/3 |

OTHER PUBLICATIONS

Attard et al., "Mesoporous platinum films from lyotropic liquid crystalline phases," *Science*, 278:838–840, 1997.

Kessler et al., "The behaviour of platinized platinum electrodes in acid solutions: correlation between voltammetric data and electode structure," *Journal of Applied Electrochemistry*, 16:693–702, 1986.

Maya et al., "Sputtered gold films for surface–enhanced Raman scattering," *Journal of Vacuum Science Technology A*, 15:238–242, 1997.

Maya et al., "Porous platinum electrodes derived from the reduction of sputtered platinum dioxide films," *Journal of Applied Electrochemistry*. 29:883–888, 1999.

*Primary Examiner*—Sheila V. Clark
*Assistant Examiner*—Jose' R Diaz
*Attorney, Agent, or Firm*—Williams, Morgan & Amerson

[57] ABSTRACT

A method for forming a platinum film includes providing a substrate, sputtering a crystalline platinum oxide layer over at least a portion of the substrate, and reducing the crystalline platinum oxide layer to form the platinum film. A device includes a non-conductive substrate and a platinum layer having a density of between about 2 and 5 g/cm$^3$ formed over at least a portion of the non-conductive substrate. The platinum films produced in accordance with the present invention provide porous films suitable for use as electrodes, yet require few processing steps. Thus, such films are less costly. Such films may be formed on both conductive and non-conductive substrates. While the invention has been illustrated with platinum, other metals, such as noble metals, that form a low density oxide when reactively sputtered may also be used.

27 Claims, 2 Drawing Sheets

METHOD FOR FORMING POROUS PLATINUM FILMS

This invention was made with Government support under contract DE-AC05-96OR22464 awarded by the U.S. Department of Energy to Lockheed Martin Energy Research Corporation; the Government has certain rights in this invention.

BACKGROUND OF THE INVENTION

1. Field of the Invention

This invention relates generally to the formation of metal films, and more particularly, to a method for forming a porous platinum film suitable for use in applications such as electrodes.

2. Description of the Related Art

Metal films, such as platinum films, are commonly used as electrodes in a variety of applications, including, fuel cells, batteries, and sensors. In such metal electrodes, it is desirable for the electrodes to have high specific surface areas to increase efficiency and reduce size. The specific surface area of the electrode increases as the porosity of the film used to form the electrode increases.

One current technique for forming porous platinum electrodes is directed to controlling electrodeposition parameters during a plating operation. Due to the number of processing steps, this technique is difficult to control, costly, and also requires that the substrate over which the electrode is formed be conductive.

Another technique involves the formation of a lattice and the deposition of a liquid containing a platinum salt within the windows of the lattice (Attard et al. Oct. 31, 1997. Mesopourous Platinum Films from Lyotropic Liquid Crystalline Phases. *Science,* 278, 838–840.). The platinum salt is subsequently reduced electrochemically, and the lattice is removed by extensive washing. Lyotropic crystals generated from surfactants exhibit long range periodicities with repeat distances from 2 to 15 nanometers. The electrochemical reduction of the platinum salts confined to the aqueous environments of these phases leads to the deposition of platinum films that have a long range porous structure and high specific surface area. This technique also requires a conductive substrate to perform the electrochemical reduction of the platinum salts, and is costly due to the number of processing steps involved.

Although the techniques described above are suitable for forming electrode surfaces, they are relatively costly and require a multitude of processing steps, thus making them more difficult to control. Also, because these techniques require the presence of a conductive substrate, their range of potential applications is correspondingly limited.

The present invention is directed to overcoming, or at least reducing the effects of, one or more of the problems set forth above.

SUMMARY OF THE INVENTION

One aspect of the present invention is seen in a method for forming a platinum film. The method includes providing a substrate, sputtering a crystalline platinum oxide layer over at least a portion of the substrate, and reducing the crystalline platinum oxide layer to form the platinum film.

Another aspect of the present invention is seen in a device including a non-conductive substrate and a platinum layer having a density of between about 2 and 5 $g/cm^3$ formed over at least a portion of the non-conductive substrate.

The platinum films produced in accordance with the present invention provide porous films suitable for use as electrodes, yet require few processing steps. Thus, such films are less costly. Such films may be formed on both conductive and non-conductive substrates. While the invention has been illustrated with platinum, other metals, such as noble metals, that form a low density oxide when reactively sputtered may also be used.

BRIEF DESCRIPTION OF THE DRAWINGS

The invention may be best understood by reference to the following description taken in conjunction with the accompanying drawings, in which like reference numerals identify like elements, and in which.

Figure 1:
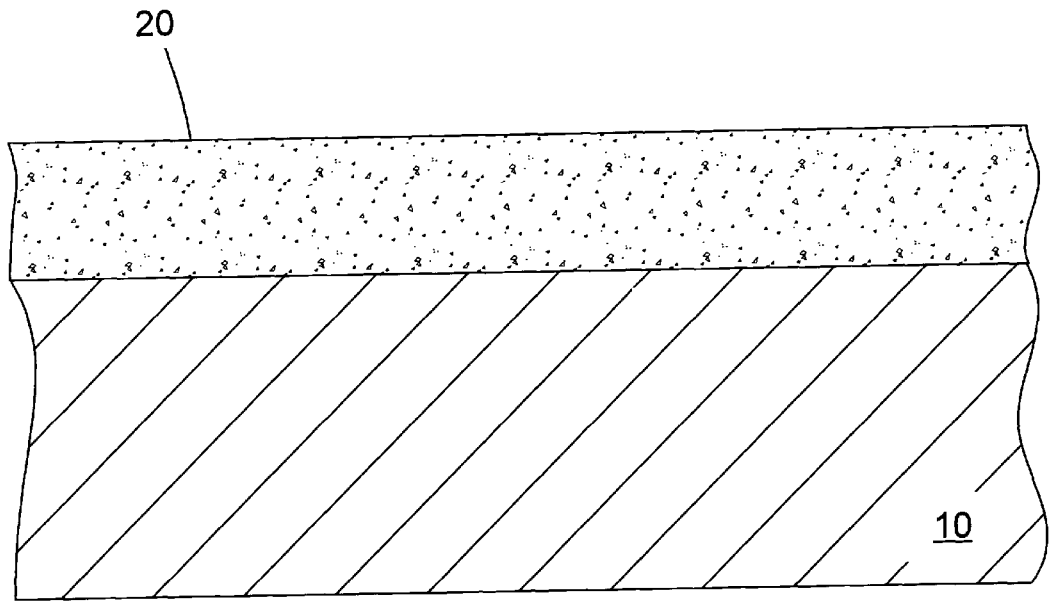
FIG. 1 is a cross-sectional view of a substrate with a layer of platinum oxide formed thereon.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the figures, and particularly, to FIG. 1. A cross-sectional view of a substrate 10 is provided. In the illustrated embodiment, the substrate 10 is gold, however, other substrate materials (e.g., silicon, quartz, and nickel) may be used. The substrate 10 may be conductive or non-conductive.

Figure 2:
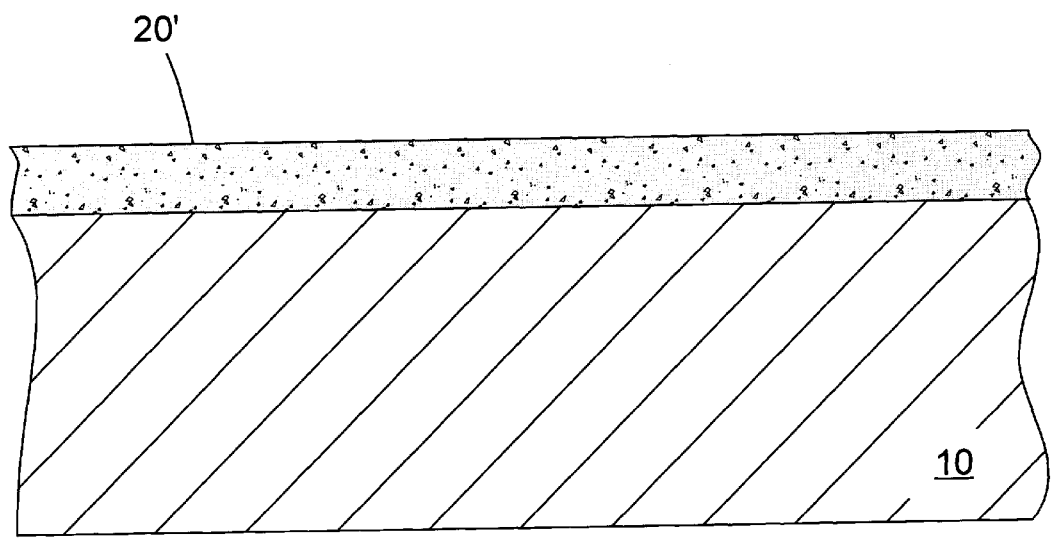
FIG. 2 is a cross-sectional view of the substrate of FIG. 1 after the platinum oxide 20 has been reduced to platinum.

As seen in FIG. 2, a layer of platinum oxide 20 is sputtered over at least a portion of the substrate 10. The platinum oxide layer 20, for example, may be deposited in a region where an electrode is desired to be formed. The patterning of the platinum oxide layer 20 in FIG. 2 is merely for illustrative purposes to indicate the porous nature of the platinum oxide layer 20 and is not intended to represent the actual microstructure of the platinum oxide layer 20.

Using a sputtering process to form the platinum oxide layer 20 is advantageous, in one respect, because substrates 10 with complex geometries may be readily covered. Another advantage is that sputtering of platinum oxide, yields a low density crystalline structure that is between about 15% to 40% of the density of an ideal solid crystal. The density of the sputtered platinum oxide layer 20 was determined to be about 2.0 g/cm$^3$ (i.e., about 20% that of platinum oxide). The structure of the sputtered platinum oxide layer 20 is that of α-PtO$_2$, which is a hexagonal crystalline phase structure. The specific sputtering process is described in greater detail below.

Other sputtered metal films, such as gold (Maya et al. March/April 1997. Sputtered gold films for surface-enhanced Raman scattering. *Journal of Vacuum Science Technology A*, 15, 238–242), typically have a density of about 60% to 80% of the ideal solid crystal, and thus, do not produce a sufficiently porous structure. While the invention is described as it may be applied to the formation of platinum layers, it is contemplated that other metals, including other noble metals, may be used provided the sputtered oxide layer has a density of less than about 50% of the base metal.

Figure 3:
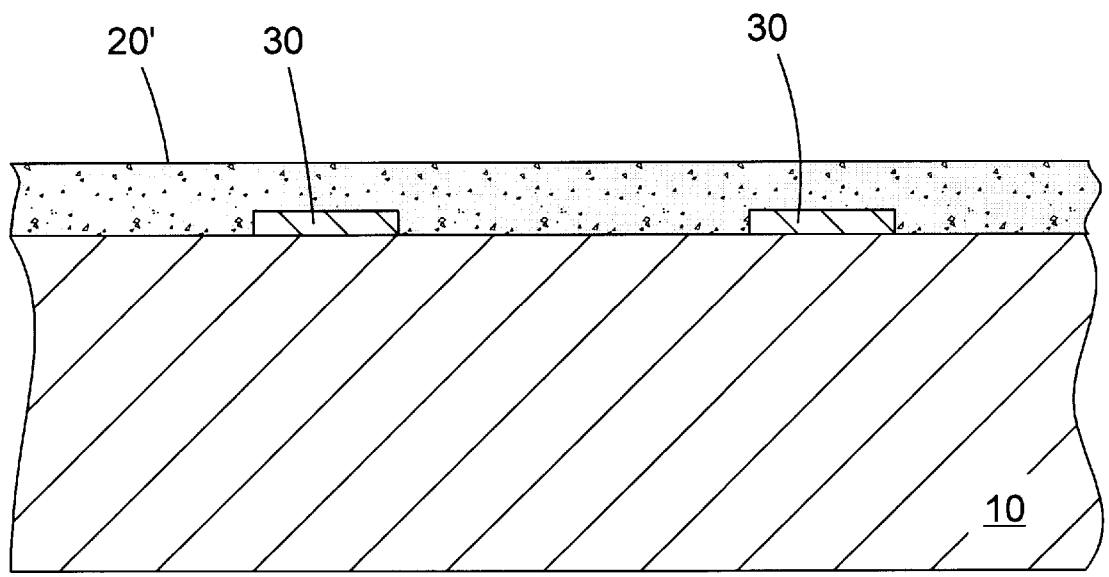
FIG. 3 is a cross-sectional view of a non-conductive substrate with conductive traces formed beneath the reduced platinum (21) layer.

As seen in FIG. 3, the platinum oxide 20 is reduced to form a platinum layer 20'. After reduction, the platinum layer 20' has a volume that is about half that of the platinum oxide layer 20 and a resulting density of about 3.4 g/cm$^3$, which is only about 16% that of platinum metal. Analysis of the microstucture of the precursor platinum oxide layer 20 reveals a porous disordered assembly of platelets that changes little upon reduction. As described in greater detail below, a variety of reduction processes may be used to form the platinum layer 20'.

Area and roughness factors for different platinum specimens are summarized below in Table 1. The samples include two films prepared as described above, one reduced electrochemically and one reduced by hydrogen. Factors for a sputtered platinum foil, a platinum wire, and a liquid crystal platinum deposition are included for comparison purposes. The efficiency of an electrode is generally defined by the ratio of its electrochemical area to its geometric area, also known as roughness. A more porous electrode material has a higher roughness coefficient, and is generally more efficient.

TABLE 1

| Sample | Treatment | Geometric Area cm$^2$(A-g) | Electrochemical Area cm$^2$ (A-e) | Roughness Factor (A-e/A-g) |
|---|---|---|---|---|
| A | Electrochemical reduction of PtO$_2$ | 0.015 | 2.25 | 150 |
| B | Hydrogen reduction of PtO$_2$ | 0.015 | 1.73 | 115 |
| C | Argon sputter of platinum foil | 0.015 | 0.74 | 49 |
| Pt wire | None | 0.6 | 0.9 | 1.5 |
| Pt film | Pt deposition in liquid crystal medium | 0.008 | 5.47 | 684 |

Although the roughness results achieved by the prior art liquid crystal technique described above are higher than that of the sputtered and reduced films, the sputtering technique is less elaborate, less costly, and easier to implement.

The platinum layer 21 is well suited for use as an electrode. In some applications, it may be desirable to form the platinum layer 21 on a non-conductive substrate 10. For example certain sensors, such as a microcantiliver or a quartz microbalance, have a mechanical response instead of an electrical response. As shown in FIG. 3, if the substrate 10 is non-conductive, yet it is still desired to communicate electrically with the platinum film 21, conductive traces 30 may be formed on the substrate 10 prior to formation of the platinum layer 21. Such traces 30 allow electrical communication with the platinum layer 21 by remote circuitry (not shown).

To further illustrate the present invention, specific parameters for the sputtering and reduction processes are described in greater detail. The platinum oxide layer 20 is formed by reactive sputtering using a 40% by volume oxygen in argon mixture in a parallel-plate DC glow discharge diode operating at 2 torr with a current of 20 mA and a voltage drop of 500V. In the illustrated embodiment, the thickness of the platinum oxide layer 20 is about 2–4 micrometers.

Reduction of the platinum oxide layer 20 to form the platinum layer 21 was accomplished by exposing the platinum oxide layer 20, at room temperature, to a stream of 4% by volume hydrogen in argon gas mixture for several minutes. The platinum oxide layer 20 may also be reduced by thermal decomposition under vacuum at 300° C., or by exposure to substantially pure carbon monoxide at 100° C.–200° C. Reduction may be implemented electrochemically using an acid medium if the substrate 10 is conductive. For example, the platinum oxide layer 20 may be reduced through exposure to a 0.5 molar sulfuric acid while providing a potential of −0.2 volts versus the standard calomel electrode for several minutes.

The advantages of forming the platinum film 21 as described above are numerous. For example, the process may be completed without any aqueous processing. Accordingly, the substrate 10 need not be electrically conductive. Forming devices, such as electrodes, using the process described herein may be accomplished using low cost, low complexity, easily controllable, and repeatable processing techniques.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a porous platinum metal film, comprising:

providing a substrate;

reactively sputtering a platinum oxide layer in an oxygen/inert gas atmosphere over at least a portion of the substrate to form a low density hexagonal platinum oxide crystalline phase structure; and reducing the platinum oxide layer to form the porous platinum metal film wherein said porous platinum metal film has a density of about 15% to about 40% of platinum metal.

2. The method of claim 1, wherein the inert gas is selected from the group consisting of nitrogen, helium, xenon and argon.

3. The method of claim 1, wherein the oxygen/inert gas atomosphere includes between about 30% and 50% oxygen by volume.

4. The method of claim 1, wherein reducing the platinum oxide layer includes electrochemically reducing the platinum oxide layer.

5. The method of claim 4, wherein electrochemically reducing the platinum oxide layer includes exposing the platinum oxide layer to an acid solution and imposing an electrical potential on the substrate.

6. The method of claim 1, wherein reducing the platinum oxide layer includes exposing the platinum oxide layer to a reducing gas.

7. The method of claim 6, wherein the reducing gas includes hydrogen.

8. The method of claim 7, wherein the reducing gas includes between about 3% and 10% hydrogen by volume.

9. The method of claim 6, wherein exposing the crystalline platinum oxide layer to a reducing gas comprises exposing the platinum oxide layer to carbon monoxide from about 100° C. to about 200° C.

10. The method of claim 1, wherein reducing the platinum oxide layer includes heating the platinum oxide layer to a temperature of about 300° C.

11. The method of claim 1, further comprising forming a conductive trace on the substrate prior to forming the crystalline platinum oxide layer.

12. The method of claim 1, wherein the platinum oxide layer has a density of between about 2 and 5 g/cm$^3$.

13. The method of claim 1 wherein the low density hexagonal platinum oxide crystalline structure is from about 2 to about 4 micrometers thick.

14. The method of claim 1 wherein the platinum oxide layer is $PtO_2$.

15. A method for forming a porous metal film, comprising:

providing a substrate;

providing a source of noble metal;

sputtering an oxide of the noble metal to form a crystalline metal oxide layer over at least a portion of the substrate, the crystalline metal oxide layer having a density of about 50% of the noble metal; and reducing the crystalline metal oxide layer to form the porous metal film wherein said film has a density of about 15% to about 40% of the noble metal.

16. The method of claim 15, wherein sputtering the crystalline metal oxide layer comprises sputtering the noble metal in the presence of a reactive gas mixture, the reactive gas mixture including oxygen.

17. The method of claim 16, wherein the reactive gas mixture further includes argon.

18. The method of claim 16, wherein the reactive gas mixture includes between about 30% and 50% oxygen by volume.

19. The method of claim 15, wherein reducing the crystalline metal oxide layer includes electrochemically reducing the crystalline metal oxide layer.

20. The method of claim 19, wherein electrochemically reducing the crystalline metal oxide layer includes exposing the crystalline metal oxide layer to an acid solution and imposing an electrical potential on the substrate.

21. The method of claim 15, wherein reducing the crystalline metal oxide layer includes exposing the metal oxide layer to a reducing gas.

22. The method of claim 21, wherein the reducing gas includes hydrogen.

23. The method of claim 22, wherein the reducing gas includes between about 3% and 10% hydrogen by volume.

24. The method of claim 21, wherein exposing the crystalline metal oxide layer to a reducing gas comprises exposing the crystalline metal oxide layer to carbon monoxide from about 100° C. to about 200° C.

25. The method of claim 15, wherein reducing the crystalline metal oxide layer includes heating the crystalline metal oxide layer to a temperature of about 300° C.

26. The method of claim 18, further comprising forming a conductive trace on the substrate prior to forming the crystalline metal oxide layer.

27. The method of claim 15, wherein the crystalline metal oxide layer has a density of between about 2 and 5 g/cm$^3$.

* * * * *